United States Patent
Nguyen et al.

(10) Patent No.: US 7,095,345 B2
(45) Date of Patent: Aug. 22, 2006

(54) HYBRID TUNING CIRCUIT FOR CONTINUOUS-TIME SIGMA-DELTA ANALOG-TO-DIGITAL CONVERTER

(75) Inventors: Khiem Nguyen, Tewksbury, MA (US); Robert W. Adams, Acton, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/936,179

(22) Filed: Sep. 8, 2004

(65) Prior Publication Data
US 2005/0285763 A1 Dec. 29, 2005

(51) Int. Cl.
*H03M 1/10* (2006.01)

(52) U.S. Cl. .................... 341/120; 341/144

(58) Field of Classification Search ........... 341/120, 341/144; 327/553, 554, 156
See application file for complete search history.

(56) References Cited

U.S. PATENT DOCUMENTS

| | | | |
|---|---|---|---|
| 5,079,550 A | | 1/1992 | Sooch et al. |
| 5,404,142 A | | 4/1995 | Adams et al. |
| 5,574,678 A | * | 11/1996 | Gorecki .................. 708/801 |
| 5,625,316 A | * | 4/1997 | Chambers et al. ......... 327/553 |
| 5,914,633 A | * | 6/1999 | Comino et al. ........... 327/553 |
| 6,069,505 A | * | 5/2000 | Babanezhad ............. 327/156 |
| 6,424,209 B1 | * | 7/2002 | Gorecki et al. ........... 327/554 |
| 6,639,534 B1 | * | 10/2003 | Khoini-Poorfard et al. . 341/144 |
| 6,714,066 B1 | * | 3/2004 | Gorecki et al. ........... 327/553 |

FOREIGN PATENT DOCUMENTS

EP 0477694 4/1992

OTHER PUBLICATIONS

"An Auto-Tuning Structure For Continuous Time Sigma-Delta Ad Converter And High Precision Filters"; Xia et al.; Analog and Mixed-Signal Center, Dept. of Electrical Engineering, Texas A & M University; 2002, IEEE; pp. 593-596, month unknown.
Walder, J.-P. et al., "A Low Power, Wide Dynamic Range Multi-Gain Signal Processor for the SNAP CCD." 2003 IEEE Nuclear Science Symposium and Medical Imaging Conference Record, New York, NY, Oct. 19, 2003. vol. 5, pp. 1-5.
Xia, Bo et al., "An Auto-Tuning Structure for Continuous Time Sigma-Delta Ad Converter and High Precision Filters," IEEE International Symposium in Circuits and Systems, ISCAS 2002, May 29, 2002. vol. 5, pp. 593-596.

* cited by examiner

*Primary Examiner*—Jean Bruner Jeanglaude
(74) *Attorney, Agent, or Firm*—Gauthier & Connors LLP

(57) ABSTRACT

A hybrid tuning circuit is used consisting of a digital finite state machine and an analog tuning circuit to effectively keep the RC product of the continuous time integrator constant across process, temperature, supply, and sampling rate variations. Since the implementation is continuous, the tracking is more accurate than traditional techniques. Using a carefully chosen clocking scheme, the technique gets rid of inter-symbol interference in the feedback DAC. The technique does not use a reference frequency, thereby eliminating the need for a user to identify a reference frequency.

24 Claims, 9 Drawing Sheets

HYBRID TUNING CIRCUIT FOR CONTINUOUS-TIME SIGMA-DELTA ANALOG-TO-DIGITAL CONVERTER

FIELD OF INVENTION

This invention relates to mixed-signal converters of the sigma-delta noise shaping type, and more particularly, to mixed-signal analog-to-digital converter that employs a hybrid continuous-time and discrete-time circuit.

BACKGROUND OF THE INVENTION

Sigma-delta analog-to-digital converters (ADCs) provide for a means to achieve high resolution and low distortion at a relatively low cost compared to traditional Nyquist converters. The high resolution is achieved by oversampling the input signal and shaping the quantization noise in the band of interest into higher frequency region. The higher frequency noise can then be digitally filtered out by the subsequent digital filter stages. The resulting data is then down sampled to the desired sample rate at the output of the converter.

Typically, an audio sigma-delta ADC is implemented using discrete-time circuits such as switched capacitors for the following reasons. Switched capacitor circuits, typically used in the implementation of the first integrator, offer low sensitivity to clock jitter and is readily scalable with sampling rate. Moreover, tracking of coefficients is inherently good due to good matching of capacitors. However, due to the discrete-time nature, the converter suffers from harmonic distortion primarily caused by signal-dependent glitches captured by the sampling capacitors of the first integrator. In highly-integrated circuits such as a digital signal processor (DSP) with on-chip converters, it is very difficult to contain these undesirable glitches since the DSP is running at a much higher clock rate than the converter. Furthermore, for high performance converters, over 100 dB of signal-to-noise ratio (SNR), the sampling capacitors have to be large to reduce the thermal noise. When such large capacitors sample the input voltage, they emit current glitches back into the signal source which leads to electromagnetic interference (EMI).

Instead of implementing the first integrator by switched capacitors, the integrator can be implemented using real resistors and capacitors, such as in the implementation of a continuous-time integrator. The U.S. patent to Sooch et al. (U.S. Pat. No. 5,079,550), hereinafter Sooch, provides for such a combination of continuous-time and discrete integrators in a sigma-delta ADC.

FIG. 1 illustrates a block diagram outlining Sooch's setup 100 comprising summer circuit 101, continuous-time integrator 102, discrete-time integrator(s) 104, quantizer 106, and current feedback digital-to-analog converter (DAC) 108. An analog input signal is connected to the positive input of a summing circuit or summer 101, with the output of summer 101 being connected to the input of loop filter 105, which is also the input to the continuous-time integrator 102. The output of the continuous-time integrator 102 is converted to a discrete-time signal. Connected to the other side of continuous-time integrator 102 is a discrete time integrator 104, wherein the output of the discrete time integrator 104 forms the output of the analog loop filter 105 and is connected to the input of quantizer 106, which, in this example, is a one bit analog-to-digital converter. The output of quantizer 106 forms the output and also forms the input to DAC 108, with the output of DAC 108 being connected to the negative input of summer 101.

Due to the nature of the continuous-time setup of the first stage, any glitches happening in the first stage are averaged out over the clock period instead of being sampled. Hence, the negative effect of these glitches on the performance of the converter is greatly reduced. This is a major advantage of continuous-time versus discrete-time implementations. Moreover, since the input impedance is purely resistive (if the feed forward path from the input is eliminated), the circuit does not emit high frequency current glitches back to the external source. The setup of Sooch yields a much lower electromagnetic interference (EMI) compared to a switched capacitor implementation. But, the Sooch setup of FIG. 1 suffers from various pitfalls, some of which are addressed below.

A major drawback associated with the combination of continuous-time and discrete-time implementation described above is that the RC time constant, or integrator gain varies significantly with process, temperature, and power supply variation. Variation in the RC product changes the noise transfer function of the loop and leads to degradation in performance of the converter.

Another disadvantage associated with such an implementation is that the RC time constant also changes with the period of the master clock of the converter which clocks the switched-capacitor network in the second stage. This essentially limits the converter operation to one particular sampling rate.

Yet another disadvantage associated with the continuous-time implementation is that the continuous-time feedback DAC has inter-symbol-interference (ISI) which dominates the harmonic distortion of the overall performance of the ADC.

An attempt to solve this problem was presented in the article by Xia et al. entitled, "An automatic tuning structure for continuous-time sigma-delta ADC and high precision filters". Xia et al. addressed stabilizing the RC product via a discrete tuning approach. FIG. 2 illustrates a simplified diagram of the prior art tuning technique as taught by Xia et al. The setup of FIG. 2 comprises reference current source 202, programmable capacitor bank 204, fixed capacitor 206, comparator 208, and tuning logic circuit 210. By calibrating the voltage at the capacitor output to a fixed voltage, the circuit produces a control code that will control both the programmable capacitor array of the tuning circuit and the programmable capacitor array of the first stage continuous-time integrator. Xia's technique suffers from a disadvantage with respect to the coarse quantization step size of the counter, which is not suitable for high precision sigma-delta ADCs. Furthermore, the use of programmable capacitor array 204 also limits the tuning to a narrow range, hence not suitable for the large variation of sampling rate required in audio ADCs.

FIG. 3 shows a conventional differential implementation of a continuous-time first stage in a sigma-delta ADC. It consists of an amplifier 300, a pair of capacitors 302, 304, a pair of input resistors 306, 308, and a feedback DAC, 310. In normal operation mode, the input voltage is converted to current via the input resistors 306, 308. The feedback DAC 310 is controlled by the digital output of the converter. As mentioned before, the low frequency content of the digital output tracks with the input. Hence, the error current, the difference between the input current and the output of the DAC, is mostly high frequency shaped noise. This noise is integrated by the capacitors 302, 304 and then sampled by the subsequent switched capacitor integrator.

Whatever the precise merits, features, and advantages of the above discussed prior art implementations, none of them achieves or fulfills the purposes of the present invention.

SUMMARY OF THE INVENTION

The present invention provides for a method comprising the steps of: (a) compensating for the variation of the RC product in the continuous-time integrator, and variation in the sampling frequency; and (b) adjusting the integration interval of said continuous-time integrator based on said compensation; and (c) adjusting the integrating capacitors based on said compensation. In one embodiment, the present invention's method eliminates inter-symbol interference based on applying a return-to-zero technique on both the input and feedback signal of the continuous-time integrator. In another embodiment, the present invention's method eliminates inter-symbol interference problem by applying a return-to-zero technique to the difference between the input and feedback signals.

The present invention also provides for a method to reduce the glitches at the drain of the current source during the transitions into and out of the return-to-zero period, wherein the method comprises the steps of: (a) disconnecting the input resistors and the feedback DAC from the integrator (b) connecting both DAC outputs and the input resistors to a known voltage during the return-to-zero period; (c) maintaining the DAC output voltage at a known level; and (d) change the DAC input code during the return-to-zero period.

The present invention also provides for a hybrid tuning circuit that works in conjunction with a modified continuous-time integrator, wherein the modified continuous-time integrator comprises a first plurality of switches and a first programmable capacitor array. The hybrid tuning circuit comprises: (a) an analog control circuit having a second programmable capacitor array and a second plurality of switches to generate and continuously adjust an integration control signal via controlling the first plurality of switches, wherein the integration control signal controls integration time of the continuous-time integrator; and (b) a finite state machine monitoring the integration control signal, wherein the finite state machine decrements and increments capacitor size in capacitor arrays of said continuous-time integrator and said analog control circuit.

The present invention also provides for a modified continuous-time integrator comprising: (a) a digital-to-analog converter (DAC); (b) a plurality of input resistors; (c) an operational amplifier; (d) a plurality of switches controllable via a hybrid tuning circuit; (e) a plurality of programmable capacitor arrays; (f) a fixed capacitor; and wherein the switches either connect the input resistors and DAC outputs to respective summing junctions of the operational amplifier during an integration period, or the switches disconnect the resistors and DAC outputs from the operational amplifier, and connect the input resistors and DAC outputs to a known voltage.

The present invention also provides for a finite state machine comprising: (a) means for monitoring an integration control signal from an analog control circuit, and (b) means for decrementing capacitor size in the continuous-time integrator when necessary; (c) means for incrementing capacitor size in the integrator when necessary.

DETAILED DESCRIPTION OF THE INVENTION

Although the present invention has been shown and described with respect to several preferred embodiments thereof, various changes, omissions and additions to the form and detail thereof, may be made therein, without departing from the spirit and scope of the invention.

The present invention uses a hybrid tuning circuit comprising a digital finite state machine and an analog control circuit to effectively keep the RC product of the continuous time integrator constant across process, temperature, supply and sampling rate variations. Because the present invention's implementation is continuous in nature, the tracking is much more accurate than traditional techniques mentioned before. Moreover, the present invention allows for a wide variation of sampling rate which is not possible in prior arts.

Figure 1:
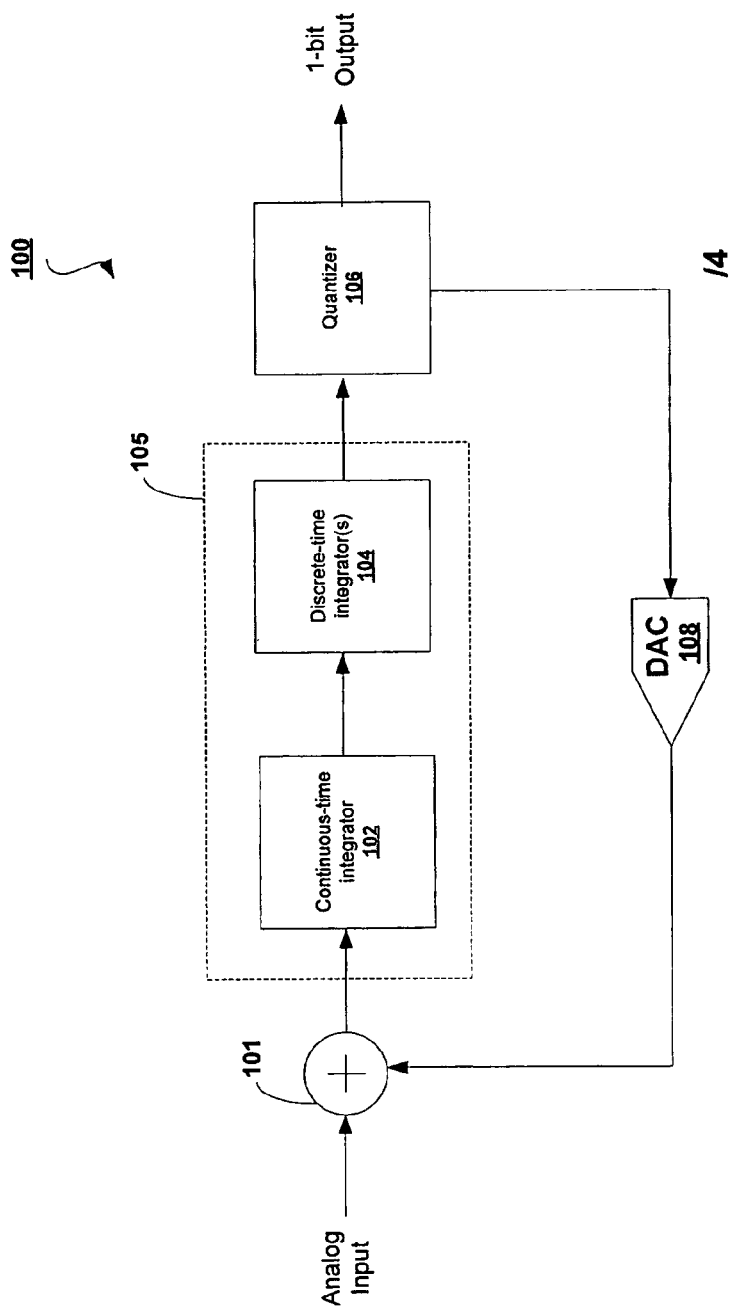
FIG. 1 illustrates the prior art of a combination continuous-time and discrete-time implementation of a sigma-delta ADC.
Figure 2:
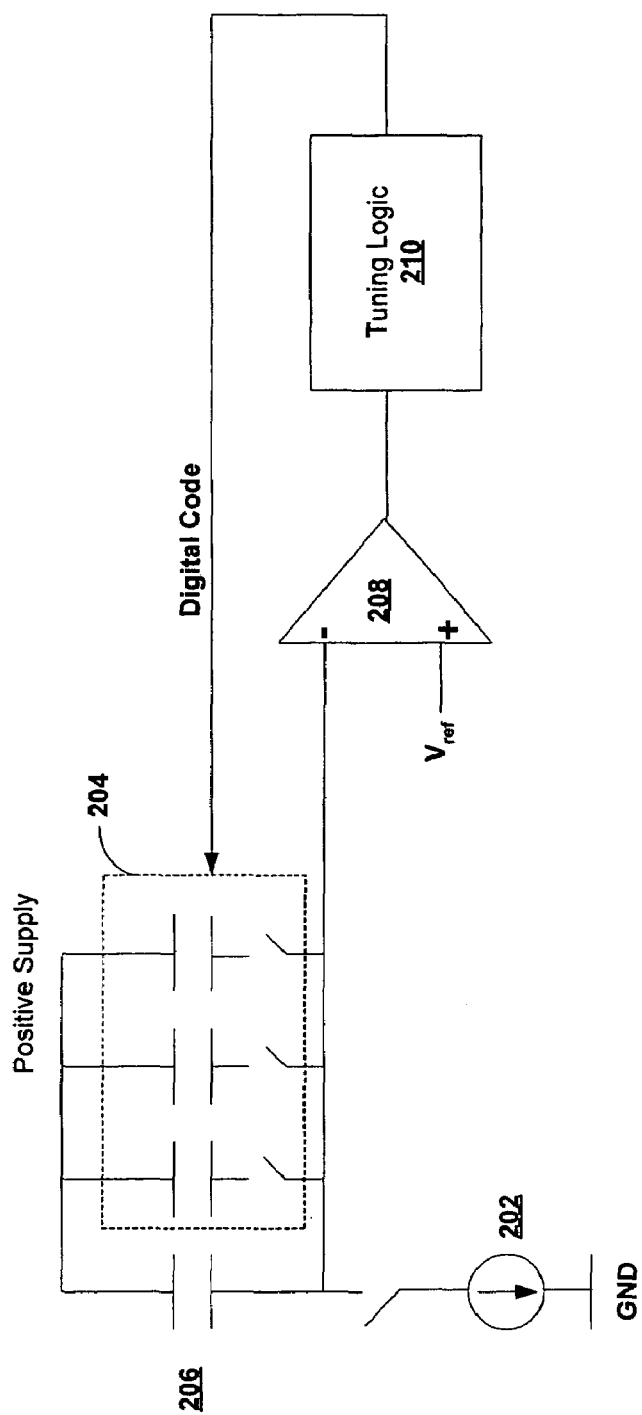
FIG. 2 shows a prior art discrete tuning technique.
Figure 3:
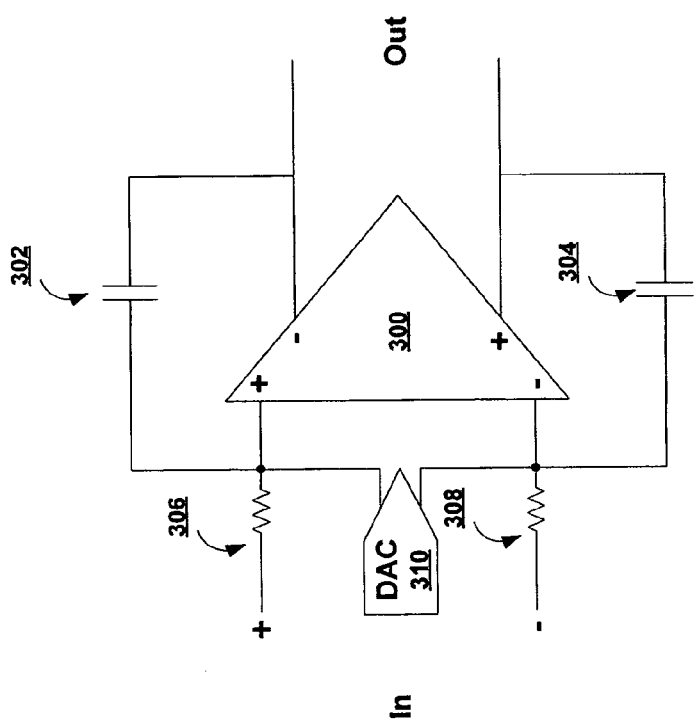
FIG. 3 shows a conventional differential implementation of a continuous-time integrator.
Figure 4:
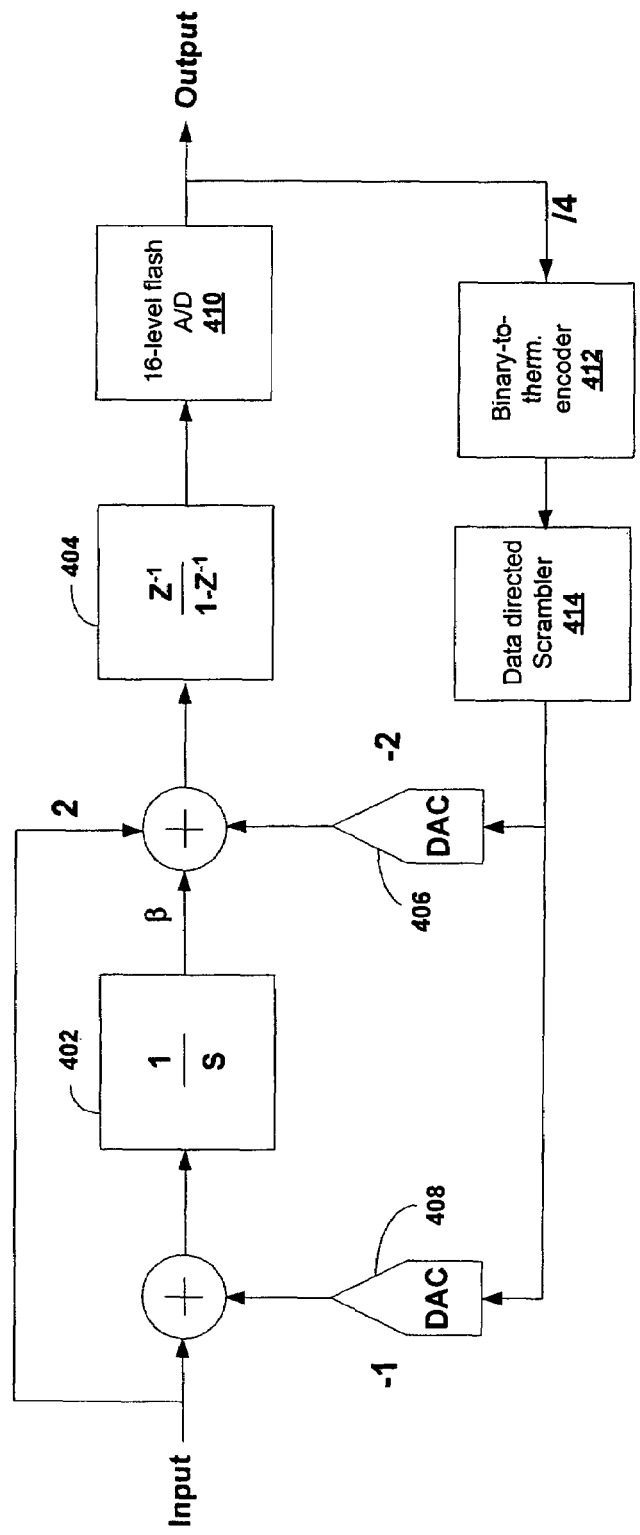
FIG. 4 shows the block diagram of a 4-bit sigrna-delta analog-to-digital converter with a continuous-time first-stage in this invention.

According to a further aspect of the present invention, a carefully chosen clocking scheme is provided, wherein the scheme eliminates the inter-symbol-interference (ISI) in the feedback DAC which is a major pitfall associated with prior art continuous time ADC designs. It should be noted that the present invention's technique does not use a reference frequency for calibration, thereby eliminating the need for a user to identify a this reference FIG. 4 illustrates a simplified model of a 4-bit, $2^{nd}$-order sigma delta analog-to-digital converter with a continuous-time first-stage used in this invention. The setup primarily comprises continuous-time integrator 402, switched capacitor DAC 406, switched capacitor integrator 404, current steering DAC 408, a 16-level flash ADC 410, a binary-to-thermometer code encoder 412, a data-directed scrambler 414.

Figure 5:
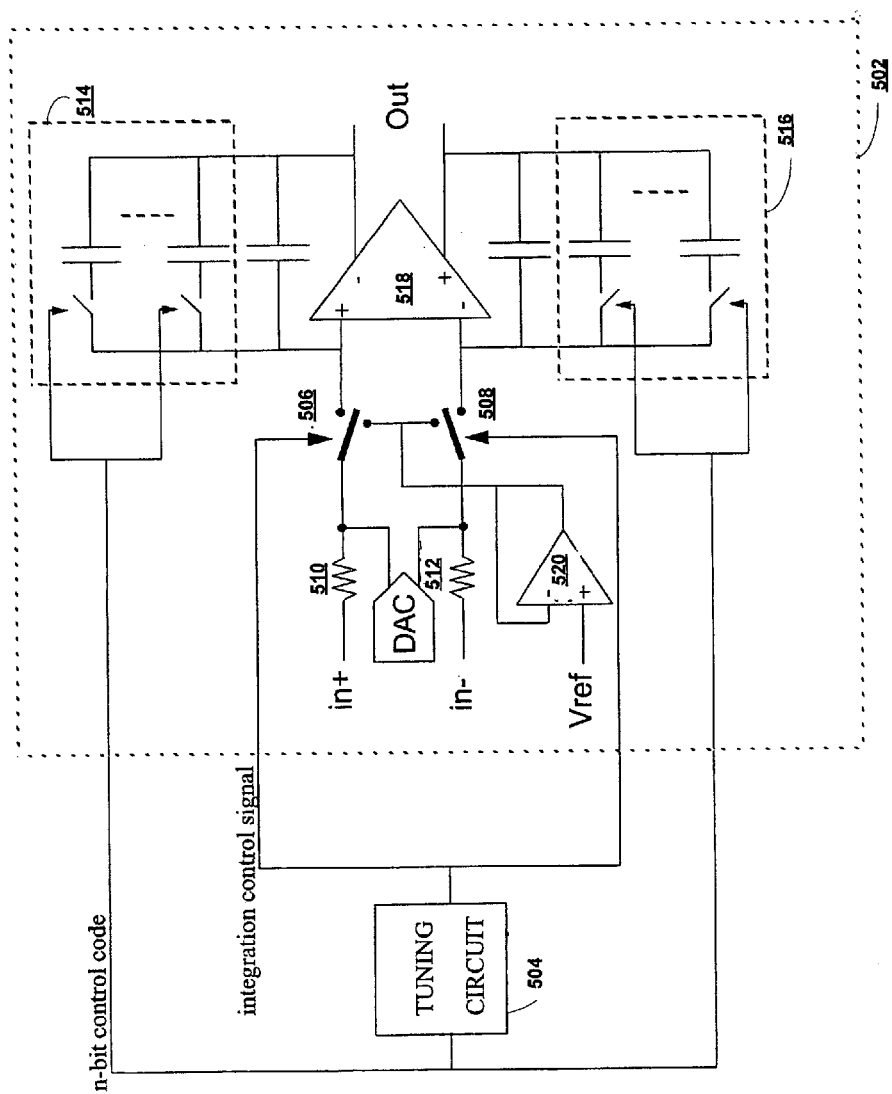
FIG. 5 illustrates an exemplary embodiment of the present invention, wherein the depicted circuit eliminates the above-mentioned problems with respect to the prior art.

FIG. 5 illustrates an exemplary embodiment of the present invention, wherein circuit 500 of FIG. 5 eliminates the above-mentioned problems with respect to the prior art. Circuit 500 consists of two sections: a modified continuous-time integrator 502 and a tuning circuit 504. The said modified continuous-time integrator has a pair of switches 506 and 508 in series with input resistors 510 and 512, an amplifier 518, DAC 526, and a voltage buffer 520. The switches 506 and 508 are controlled by the tuning circuit 504. The programmable capacitor arrays 514 and 516 are also controlled by the tuning circuit 504.

Figure 6:
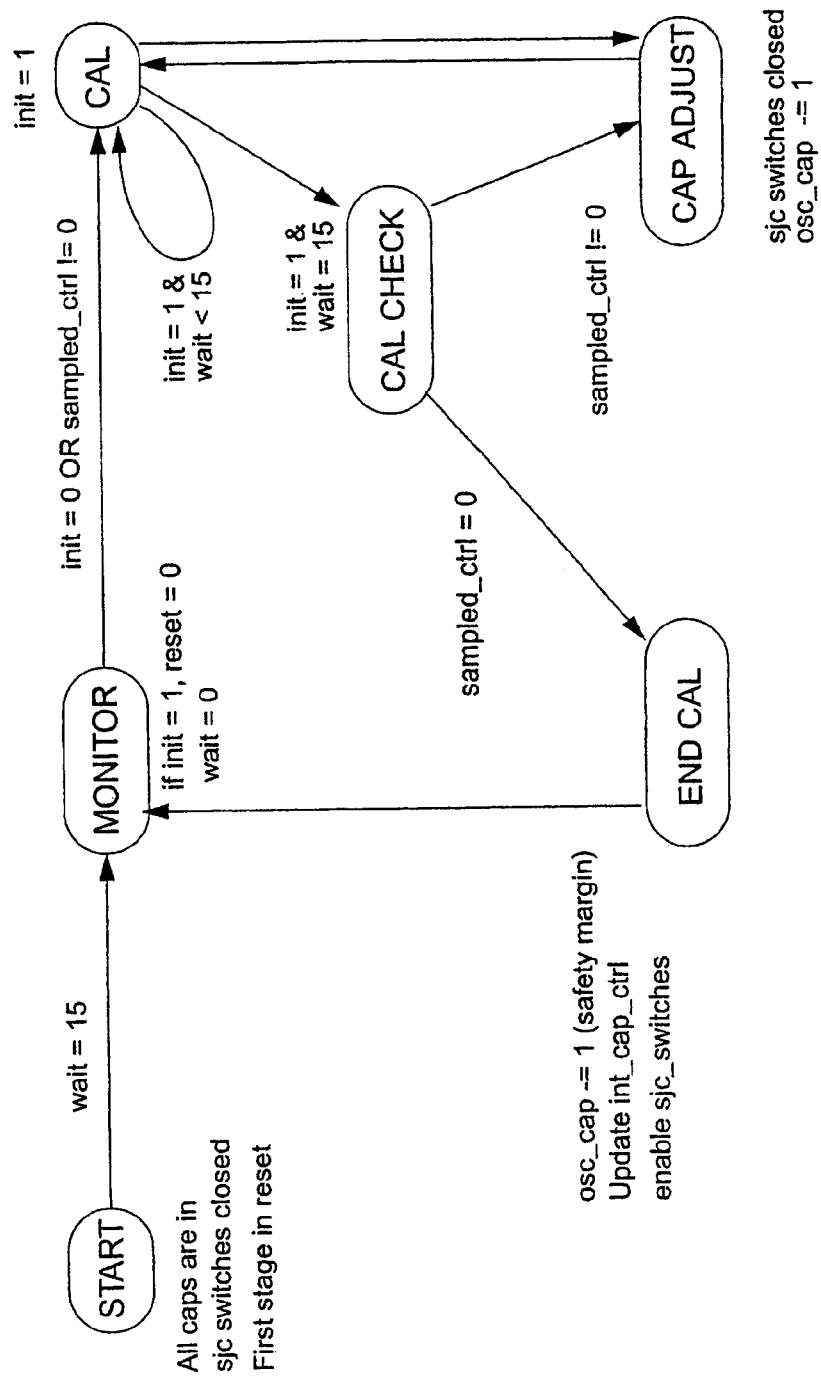
FIG. 6 illustrates an exemplary embodiment of the tuning circuit's digital finite state machine.

The tuning circuit 504 comprises a finite state machine and an analog control block. FIG. 6 illustrates an exemplary embodiment of tuning circuit 304's finite state machine. The finite stage machine comprises of several D flip-flops and combinational logics to perform the task described by the flow chart in FIG. 4, a 4-bit binary counter to control the capacitor arrays in the analog tuning circuit and also the capacitor arrays in the said continuous-time integrator. The implementation of the finite state machine can be either in a hardware description language or simply by manual design.

Figure 7:
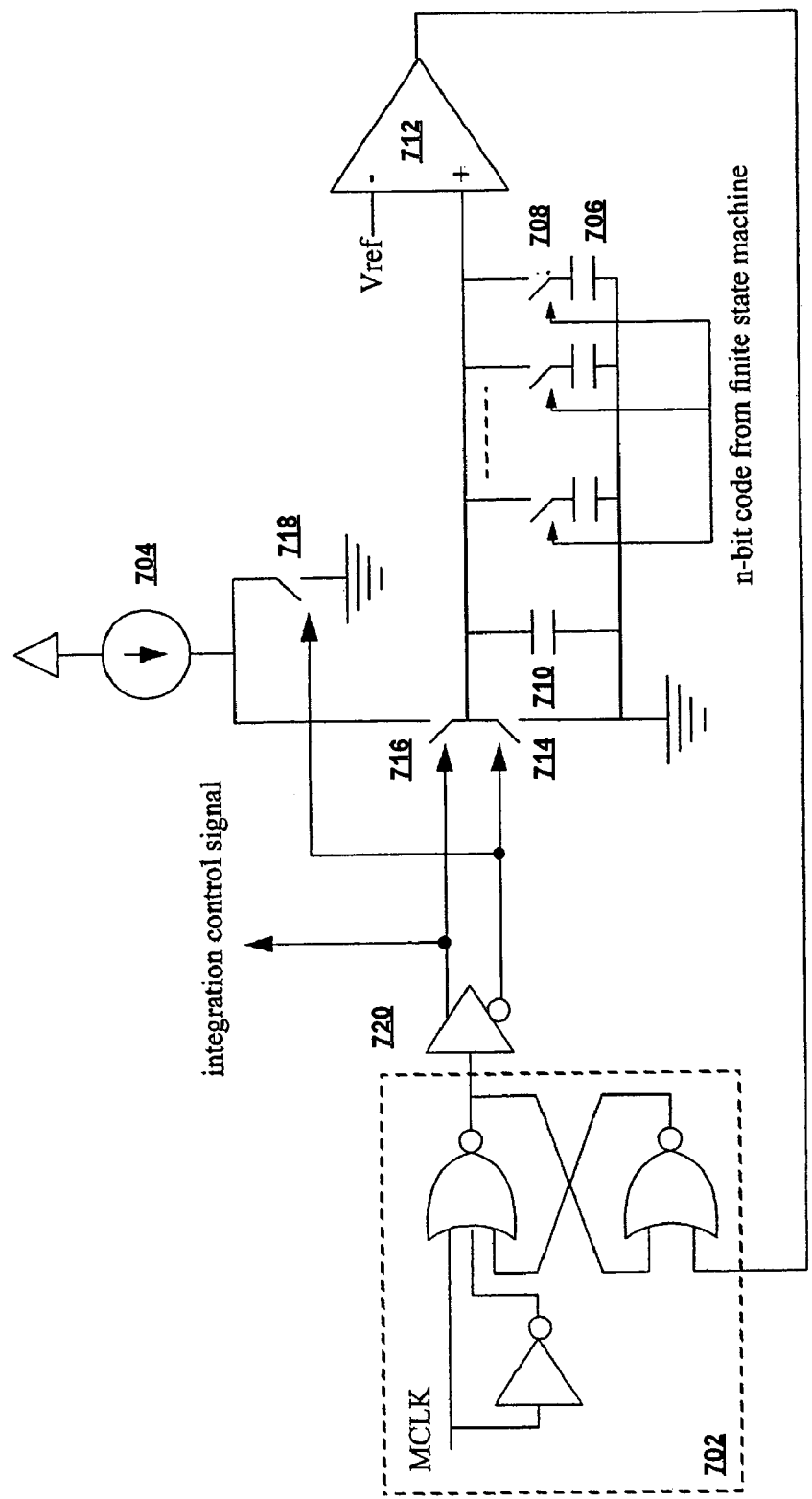
FIG. 7 illustrates an exemplary embodiment of the analog control circuit.

FIG. 7 illustrates an exemplary embodiment of the analog control circuit described above. The analog control circuit consists of a pulse generator combined with a RESET-SET (RS) flip flop 702, a current source 704 biased by the same bias voltage of the DAC, an array of programmable capacitors 706, an array of switches 708, a fixed capacitor 710, a comparator 712, a pair of switches 714, 716, a shunt switch 718. The ratio of the sum of the programmable capacitors to the fixed capacitor is identical to those in the modified continuous-time integrator 502. Both the programmable capacitor arrays in the tuning circuit and the said continuous-time integrator are controlled by the same digital code from the finite stage machine. The input of the analog circuit consists of the master clock, the clock of the overall ADC, the digital code from the said finite stage. The analog control circuit produces an integration control signal which controls the switches 506 and 508 of FIG. 5.

Returning to the discussion of FIG. 5; a goal is to change the integration period, the period when the two switches 506 and 508 in the integrator are closed, proportionally to the change of the RC product so that the final voltage at the integrator output is constant in the presence of process, power supply, temperature, and sampling rate variations. This action is accomplished automatically in the analog control circuit by increasing or decreasing the integration control signal. Another goal is to cut down the feedback capacitors (514 and 516) in the integrator according to the instruction from the tuning circuit 504's finite state machine.

Figure 8:
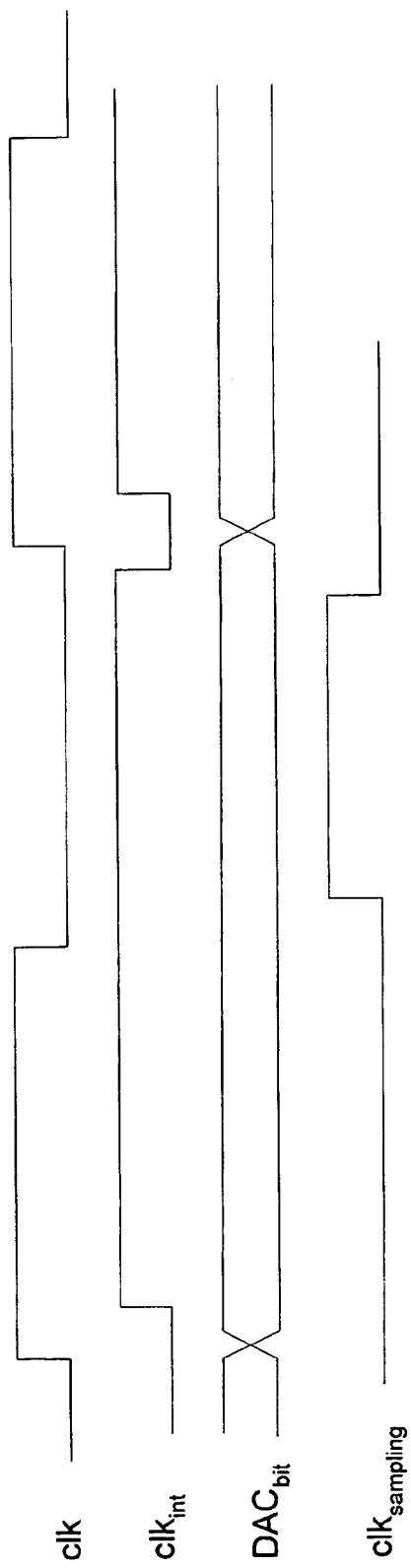
FIG. 8 illustrate a timing diagram depicting the switching scheme.

The operation of the tuning circuit can be described as follow. On power up, the analog control circuit is in reset state. In this state, the comparator output is at 0, all the capacitors in the control circuit 500 and the integrator 502 are switched in, and both of the switches 506 and 508 in the integrator are closed. This configuration creates an un-tuned continuous-time integrator. When the reset signal is de-asserted, the tuning circuit 504 will be functional. FIG. 8 illustrates this scenario. On the rising edge of the master clock, the pulse generator creates a pulse which triggers the RESET-SET flip-flop circuit. The output of the flip-flop then turns on the two switches 506 and 508 in the continuous-time integrator which start the integration period. At the same time, the scaled current source 704 (of FIG. 7) starts to charge up the capacitors. When the voltage at the output of the capacitor array crosses the threshold of the comparator, the comparator will trip. It then resets the RS flip flop and ends the integration period. Switch 714 then discharges the voltage on the capacitors in the tuning circuit. During this time, switch 718 connects the output of the current source 704 to ground, thus discharges any voltage captured by the parasitic capacitor at that node.

The analog control circuit in FIG. 7 is designed such that the integration period ends before the next rising edge of the clock. During the non-integrating time, the time when both switches in the integrator are opened, the DAC bits can change to the next value (as shown in FIG. 8). When the next integration period commences, the DAC bits have already been set to the proper value. This means the integrator has no memory of the previous data of the DAC. Hence, the integrator is free of inter-symbol-interference. Those who are skilled in the art can think of this as a return-to-zero scheme applying on the error signal, the difference between the feed-in and feedback current. The benefit of this scheme are as follow: (a) the RTZ is applied on the small error signal which flows through the switches in the integrator, hence, it does not present any additional stress to the operational amplifier in the integrator; and (b) the switches do not conduct any signal related current hence, do not cause distortion to the converter performance. This is a major advantage compared to traditional RTZ on DAC only implementation.

Figure 9:
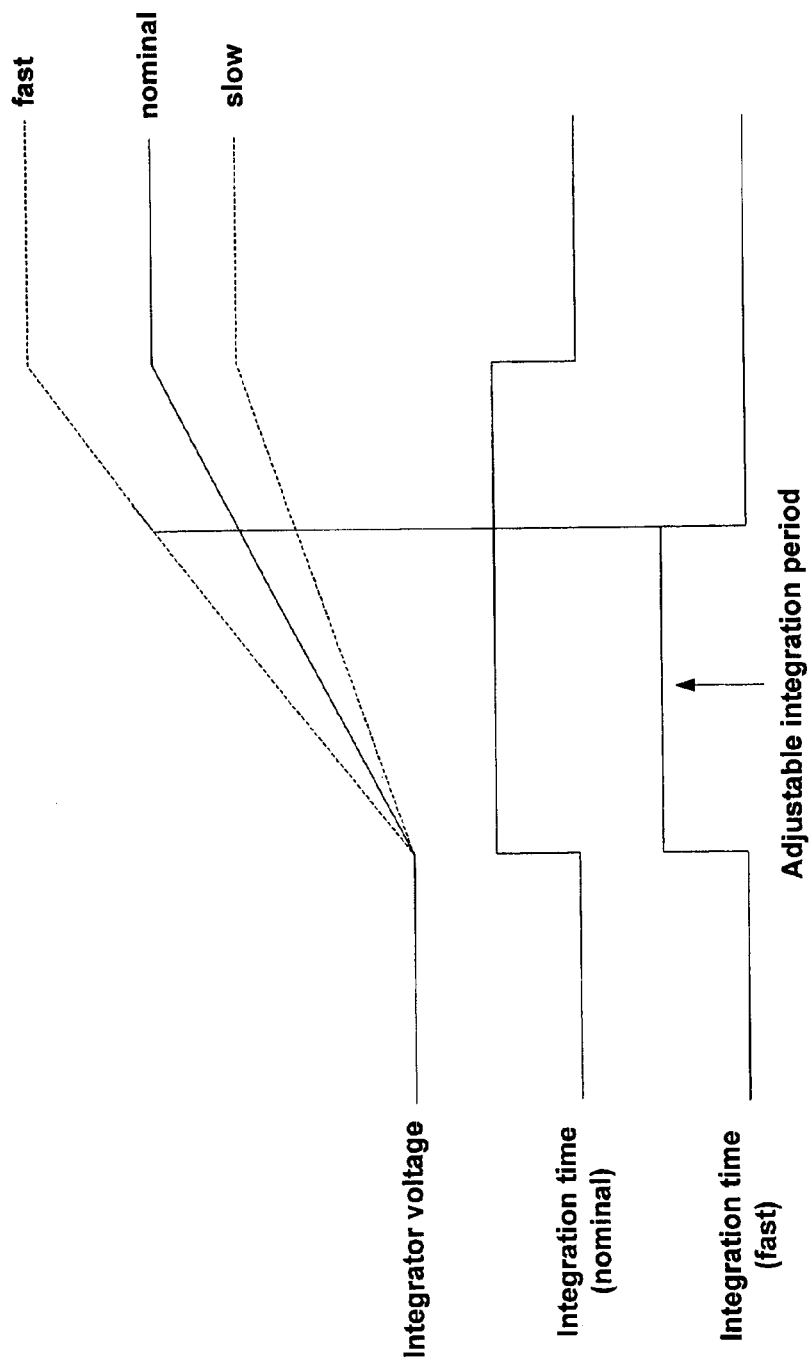
FIG. 9 illustrates a graph of the integrator voltage versus the integration time.

The finite state machine of FIG. 6 constantly monitors the integration control signal. In the event where the capacitors are smaller than nominal due to process variation, the voltage at the output of the capacitor array in the analog control circuit will reach the threshold of the comparator earlier than normal. The output of the integrator will also rise faster than normal. But when the comparator trips, it shortens the integration period. Therefore, the final voltage at the integrator output is still the same as in the normal case; this scenario is illustrated in FIG. 9.

In the event where the capacitors are larger than normal due to process variation, the voltage at the output of the capacitor array in the analog control circuit will reach the threshold voltage later than normal. The output of the integrator will also rise slower than normal. Therefore, it takes longer for the comparator to trip. The integration period becomes longer than normal. The tuning circuit tracks continuously until the integration period becomes longer than one clock period. When this happens, the finite state machine will decrement the programmable capacitor array in the analog control circuit. It will continue to do so until the integration period is shorter than one clock period. At this point, the tuning circuit will change the programmable capacitors in the continuous-time integrator to the same code as used in the analog control circuit. The upper limit of the sampling rate variation is therefore, the ratio between the programmable capacitor array to the sum of programmable and fixed capacitors in the tuning circuit.

After the calibration is completed, the tuning circuit will be in a monitor state where it continuously examines the integration control signal and restarts calibration if necessary. To ensure un-interrupted operation for the continuous-time integrator, the switches 506 and 508 are always closed during calibration. Also, the capacitor arrays in the continuous-time integrator are only updated at the end of the calibration cycle.

What is claimed is:

1. A hybrid tuning circuit working in conjunction with a modified continuous-time integrator, said modified continuous-time integrator comprising a first plurality of switches and a first programmable capacitor array, said hybrid tuning circuit comprising:

an analog control circuit comprising a second programmable capacitor array and a second plurality of switches to generate and continuously adjust an integration control signal via controlling said first plurality of switches; said integration control signal controlling integration time of said continuous-time integrator; and a finite state machine monitoring said integration control signal, wherein said finite state machine decrements and increments capacitor size in capacitor arrays of said continuous-time integrator and said analog control circuit.

2. A hybrid tuning circuit working in conjunction with a modified continuous-time integrator, as per claim 1, wherein said first plurality of switches are closed proportionally to a change in a RC product such that the final voltage at said continuous-time integrator is constant in the presence of process, power supply, temperature, and sampling rate variations.

3. A hybrid tuning circuit working in conjunction with a modified continuous-time integrator, as per claim 2, wherein said first plurality of switches are closed proportionally via increasing or decreasing said integration control signal.

4. A hybrid tuning circuit working in conjunction with a modified continuous-time integrator, as per claim 1, wherein said modified continuous-time integrator further comprises a first fixed capacitor, and said first plurality of switches either connect input resistors and DAC outputs of a continuous-time integrator to the respective summing junctions of an operational amplifier during the integration period, or said first plurality of switches disconnect the resistors and DAC outputs from said operational amplifier, and connect the input resistors and DAC outputs to a known voltage.

5. A hybrid tuning circuit working in conjunction with a modified continuous-time integrator, as per claim 1, wherein said analog control circuit further comprises:
    a pulse generator;
    an RS flip-flop;
    a current source biased from the current steering DAC biasing circuit;
    a second fixed size capacitor; and
    a comparator.

6. A hybrid tuning circuit working in conjunction with a modified continuous-time integrator, as per claim 1, wherein said modified continuous-time integrator and analog control circuit further comprises a first and second fixed capacitor respectively and the ratio of the sum of the first programmable capacitor array to the first fixed capacitor is equal to the sum of the second programmable capacitor array to the second fixed capacitor.

7. An integrated circuit implementing a hybrid tuning circuit working in conjunction with a modified continuous-time integrator component, said modified continuous-time integrator comprising a first plurality of switches and a first programmable capacitor array, said integrated circuit comprising:
    an analog control circuit component comprising a second programmable capacitor array and a second plurality of switches to generate and continuously adjust an integration control signal via controlling said first plurality of switches; said integration control signal controlling integration time of said continuous-time integrator; and
    a finite state machine component monitoring said integration control signal, wherein said finite state machine decrements and increments capacitor size in capacitor arrays of said continuous-time integrator and said analog control circuit.

8. An integrated circuit implementing a hybrid tuning circuit working in conjunction with a modified continuous-time integrator component, as per claim 7, wherein said first plurality of switches are closed proportionally to a change in a RC product such that the final voltage at said continuous-time integrator is constant in the presence of process, power supply, temperature, and sampling rate variations.

9. An integrated circuit implementing a hybrid tuning circuit working in conjunction with a modified continuous-time integrator component, as per claim 8, wherein said first plurality of switches are closed proportionally via increasing or decreasing said integration control signal.

10. An integrated circuit implementing a hybrid tuning circuit working in conjunction with a modified continuous-time integrator component, as per claim 7, wherein said modified continuous-time integrator component further comprises a first fixed capacitor, and said first plurality of switches either connect input resistors and DAC outputs of said continuous-time integrator component to the respective summing junctions of an operational amplifier during the integration period, or said first plurality of switches disconnect the resistors and DAC outputs from said operational amplifier, and connect the input resistors and DAC outputs to a known voltage.

11. An integrated circuit implementing a hybrid tuning circuit working in conjunction with a modified continuous-time integrator component, as per claim 7, wherein said analog control circuit component further comprises:
    a pulse generator;
    an RS flip-flop;
    a current source biased from the current steering DAC biasing circuit;
    a second fixed size capacitor; and
    a comparator.

12. An integrated circuit implementing a hybrid tuning circuit working in conjunction with a modified continuous-time integrator component, as per claim 7, wherein said modified continuous-time integrator component and analog control circuit component further comprises a first and second fixed capacitor respectively and the ratio of the sum of the first programmable capacitor array to the first fixed capacitor is equal to the sum of the second programmable capacitor array to the second fixed capacitor.

13. A modified continuous-time integrator comprising:
    a digital-to-analog converter (DAC);
    a plurality of input resistors;
    an operational amplifier;
    a plurality of switches controllable via a hybrid tuning circuit;
    a plurality of programmable capacitor arrays;
    a fixed capacitor; and
    wherein said switches either connect said input resistors and DAC outputs to respective summing junctions of said operational amplifier during an integration period, or said switches disconnect said resistors and DAC outputs from said operational amplifier, and connect said input resistors and DAC outputs to a known voltage.

14. A modified continuous-time integrator, as per claim 13, wherein said hybrid tuning circuit further comprises:
    an analog control circuit comprising a second programmable capacitor array and a second plurality of switches to generate and continuously adjust an integration control signal via controlling said first plurality of switches; said integration control signal controlling integration time of said continuous-time integrator; and
    a finite state machine monitoring said integration control signal, wherein said finite state machine decrements and increments capacitor size in capacitor arrays of said continuous-time integrator and said analog control circuit.

15. A modified continuous-time integrator, as per claim 14, wherein said first plurality of switches are closed proportionally to a change in a RC product such that the final voltage at said continuous-time integrator is constant in the presence of process, power supply, temperature, and sampling rate variations.

16. A modified continuous-time integrator, as per claim 15, wherein said first plurality of switches are closed proportionally via increasing or decreasing said integration control signal.

17. A modified continuous-time integrator, as per claim 14, wherein said modified continuous-time integrator further comprises a first fixed capacitor, and said first plurality of switches either connect input resistors and DAC outputs of a continuous-time integrator to the respective summing junctions of an operational amplifier during the integration period, or said first plurality of switches disconnect the resistors and DAC outputs from said operational amplifier, and connect the input resistors and DAC outputs to a known voltage.

18. A finite state machine implemented in a tuning circuit along with an analog tuning block, said tuning circuit working in conjunction with a modified continuous-time integrator, said modified continuous-time integrator comprising a first plurality of switches and a first programmable capacitor array, said finite state machine comprising:
  means for monitoring an integration control signal from said analog tuning block, and
  means for decrementing and incrementing capacitor size of said first programmable capacitor array in said continuous-time integrator based on said monitoring of said integration control signal.

19. A finite state machine as per claim 18, wherein said analog gain tuning block comprises a second programmable capacitor array and a second plurality of switches to generate and continuously adjust said integration control signal via controlling said first plurality of switches; said integration control signal controlling integration time of said continuous-time integrator.

20. A finite state machine as per claim 18, wherein said first plurality of switches are closed proportionally to a change in a RC product such that the final voltage at said continuous-time integrator is constant in the presence of process, power supply, temperature, and sampling rate variations.

21. A finite state machine as per claim 20, wherein said first plurality of switches are closed proportionally via increasing or decreasing said integration control signal.

22. A finite state machine as per claim 18, wherein said analog tuning block comprises:
  a pulse generator;
  a RS flip-flop;
  a current source biased from the current steering DAC biasing circuit;
  a pair of switches controlling said current source;
  a fixed size capacitor;
  a programmable capacitor array programmed by a digital code from said finite state machine; and
  a comparator.

23. A method of adjusting the integration period in a continuous-time integrator, said method comprising the steps of:
  generating an integration control signal;
  turning ON and OFF the difference between the feed-in and feedback currents of said continuous-time integrator; and
  controlling the integration period of said continuous-time integrator by said integration control signal, wherein
  said method further comprises the following steps to reduce inter-symbol interference of a feedback DAC:
  turning OFF said integration control signal;
  changing a DAC code during OFF phase; and
  turning ON said integration control signal.

24. A method of adjusting the integration period in a continuous-time integrator, said method comprising the steps of:
  generating an integration control signal;
  separately turning ON and OFF the feed-in and feedback currents of said continuous-time integrator; and
  controlling the integration period of said continuous-time integrator by said integration control signal, wherein
  said method further comprises the following steps to reduce inter-symbol interference of a feedback DAC:
  turning OFF said integration control signal;
  changing a DAC code during OFF phase; and
  turning ON said integration control signal.

* * * * *

UNITED STATES PATENT AND TRADEMARK OFFICE
CERTIFICATE OF CORRECTION

PATENT NO. : 7,095,345 B2  Page 1 of 1
APPLICATION NO. : 10/936179
DATED : August 22, 2006
INVENTOR(S) : Nguyen et al.

It is certified that error appears in the above-identified patent and that said Letters Patent is hereby corrected as shown below:

On Title page of Patent, on line 22, insert the following: -- Related U.S. Application Data--

On Title page of Patent, line 24, insert -- (60) Provisional application No. 60/583,756, filed on June 29, 2004.--

Signed and Sealed this

Twenty-second Day of May, 2007

JON W. DUDAS
*Director of the United States Patent and Trademark Office*